United States Patent
Ran

(10) Patent No.: US 11,140,794 B2
(45) Date of Patent: Oct. 5, 2021

(54) PORTABLE ELECTRONIC APPARATUS, FLEXIBLE DISPLAY DEVICE THEREOF AND DRIVING MECHANISM OF FLEXIBLE DISPLAY SCREEN

(71) Applicant: Guangdong OPPO Mobile Telecommunications Corp., Ltd., Guangdong (CN)

(72) Inventor: Ke Ran, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 0 days.

(21) Appl. No.: 16/518,554

(22) Filed: Jul. 22, 2019

(65) Prior Publication Data

US 2020/0029451 A1 Jan. 23, 2020

(30) Foreign Application Priority Data

Jul. 23, 2018 (CN) .......................... 201810823268.3
Jul. 23, 2018 (CN) .......................... 201821172641.5

(51) Int. Cl.
*H05K 5/02* (2006.01)
*G06F 1/16* (2006.01)
(Continued)

(52) U.S. Cl.
CPC .......... *H05K 5/0217* (2013.01); *G06F 1/1652* (2013.01); *H05K 5/0017* (2013.01); *H05K 5/0086* (2013.01); *H04M 1/0268* (2013.01)

(58) Field of Classification Search
CPC .. H05K 5/0217; H05K 5/0017; H05K 5/0086; G06F 1/1652; H04M 1/0268
See application file for complete search history.

(56) References Cited

U.S. PATENT DOCUMENTS 7,347,019 B1 * 3/2008 Shaw ...................... F16F 1/025
40/607.01
2007/0241002 A1 * 10/2007 Wu ........................ G06F 1/1601
206/150
(Continued)

FOREIGN PATENT DOCUMENTS

CN 106448465 A 2/2017
CN 106875846 A 6/2017
(Continued)

OTHER PUBLICATIONS

International search report issued in corresponding international application No. PCT/CN2019/093848, dated Oct. 10, 2019 (4 pages).
(Continued)

*Primary Examiner* — Abhishek M Rathod
*Assistant Examiner* — Keith DePew
(74) *Attorney, Agent, or Firm* — Young Basile Hanlon & MacFarlane, P.C.

(57) ABSTRACT

A flexible display device may include a flexible display screen, a rotating shaft, a resetting mechanism, and a positioning mechanism. The flexible display screen is wound on the rotating shaft. The resetting mechanism may be connected to the rotating shaft. The resetting mechanism may be operable to drive the rotating shaft to rotate to unfold the flexible display screen. The positioning mechanism may be configured to position the unfolded flexible display screen; and the resetting mechanism may be further operable to drive the rotating shaft to rotate in an opposite direction such that the flexible display in the unfolded state may be wound on the rotating shaft.

18 Claims, 17 Drawing Sheets

(51) Int. Cl.
*H05K 5/00* (2006.01)
*H04M 1/02* (2006.01)

(56) References Cited

U.S. PATENT DOCUMENTS

| | | | | |
|---|---|---|---|---|
| 2009/0223641 | A1* | 9/2009 | Cheng | E06B 9/42 |
| | | | | 160/318 |
| 2010/0199543 | A1* | 8/2010 | Beresnitzky | A01M 23/005 |
| | | | | 43/58 |
| 2010/0258601 | A1* | 10/2010 | Thrope | A45C 1/00 |
| | | | | 224/267 |
| 2011/0185611 | A1* | 8/2011 | Adams | H04Q 5/22 |
| | | | | 40/633 |
| 2011/0304562 | A1* | 12/2011 | Wu | G06F 3/0221 |
| | | | | 345/173 |
| 2012/0019401 | A1* | 1/2012 | Wu | G06F 3/0221 |
| | | | | 341/22 |
| 2012/0298824 | A1* | 11/2012 | West | F16B 2/205 |
| | | | | 248/316.7 |
| 2013/0044215 | A1* | 2/2013 | Rothkopf | G06F 1/163 |
| | | | | 348/143 |
| 2015/0156905 | A1* | 6/2015 | Blochlinger | F16F 1/027 |
| | | | | 206/736 |
| 2015/0340004 | A1* | 11/2015 | Pang | G06F 1/1652 |
| | | | | 345/205 |
| 2016/0139633 | A1* | 5/2016 | Lee | G06F 1/1652 |
| | | | | 345/33 |
| 2016/0174668 | A1* | 6/2016 | Script | A44B 18/0084 |
| | | | | 24/306 |
| 2017/0196102 | A1* | 7/2017 | Shin | H05K 1/111 |
| 2017/0364121 | A1 | 12/2017 | Liu et al. | |
| 2018/0081473 | A1* | 3/2018 | Seo | H05K 5/0017 |
| 2019/0098774 | A1* | 3/2019 | Park | G09F 9/301 |
| 2020/0221586 | A1* | 7/2020 | Gao | G09F 9/3026 |

FOREIGN PATENT DOCUMENTS

| | | |
|---|---|---|
| CN | 107067981 A | 8/2017 |
| CN | 107331301 A | 11/2017 |
| CN | 108664087 A | 10/2018 |
| CN | 208538027 U | 2/2019 |

OTHER PUBLICATIONS

European search report issued in corresponding European application No. EP19187485, dated Nov. 27, 2019 (8 pages).
Indian Examination Report for IN Application 201914026944 dated Mar. 22, 2021 (7 pages).
Australian First Examination Report for Australian Application No. 2019310549; dated Aug. 18, 2021; pp. 1-3.

* cited by examiner

PORTABLE ELECTRONIC APPARATUS, FLEXIBLE DISPLAY DEVICE THEREOF AND DRIVING MECHANISM OF FLEXIBLE DISPLAY SCREEN

CROSS-REFERENCE TO RELATED APPLICATION(S)

This application claims priorities to Chinese Patent Application No. 201810823268.3, filed on Jul. 23, 2018, and Chinese Patent Application No. 201821172641.5, filed on Jul. 23, 2018, the contents of both of which are herein incorporated by reference in their entireties.

TECHNICAL FIELD

The present disclosure relates to the field of electronic apparatuses, particularly to a portable electronic apparatus and a flexible display device thereof.

BACKGROUND

Flexible display screens, due to their advantages such as flexibility, low power consumption, small size and portability, etc., are increasingly applied to portable electronic apparatuses. A current flexible display screen is usually provided on a portable electronic apparatus in a foldable or bendable manner, whereby a size of the display screen of the portable electronic apparatus is increased to some extent. However, the current flexible display screen still cannot satisfy users' requirements for large screen and portability of the electronic apparatus.

SUMMARY

In one aspect, a flexible display device is provided in some embodiments of the present disclosure. The flexible display device may include a flexible display screen, a rotating shaft, a resetting mechanism and a positioning mechanism. The flexible display screen is wound on the rotating shaft; the resetting mechanism is connected to the rotating shaft; the resetting mechanism is operable to drive the rotating shaft to rotate to unfold the flexible display screen; the positioning mechanism is configured to position the unfolded flexible display screen; and the resetting mechanism is further operable to drive the rotating shaft to rotate in an opposite direction such that the flexible display screen in the unfolded state is wound on the rotating shaft.

In another aspect, the present disclosure provides a portable electronic apparatus. The portable electronic apparatus may include a housing and a mainboard disposed within the housing. The portable electronic apparatus may further include a flexible display device which comprises: a flexible display screen, a rotating shaft, a resetting mechanism and a positioning mechanism. The flexible display screen may be wound on the rotating shaft; the resetting mechanism may be connected to the rotating shaft; the resetting mechanism may be operable to drive the rotating shaft to rotate to unfold the flexible display screen; the positioning mechanism may be configured to position the unfolded flexible display screen; and the resetting mechanism may be further operable to drive the rotating shaft to rotate in an opposite direction such that the flexible display screen in the unfolded state is wound on the rotating shaft. The flexible display device may be mounted on the housing, and the flexible display screen may be electrically connected to the mainboard.

According to still another aspect of the present disclosure, a driving mechanism of a flexible display screen may include a rotating shaft with first and second caps engaged with the two opposite ends of the rotating shaft to seal two opposite openings of the rotating shaft. A reset device may be configured to drive the rotating shaft to rotate to unfold the flexible display screen, the reset device may include a connecting shaft and a roll-up spring. The connecting shaft is configured to extend through the first cap and fixed on one corresponding end of the rotating shaft, the roll-up spring being received in the one corresponding end of the rotating shaft, one end of the roll-up spring being embedded in a free end of the connecting shaft, the other end of the roll-up spring fixed on the rotating shaft. A fixing device may be fixed on the first cap and configured to fix the unfolded flexible display screen and drive the rotating shaft to rotate in an opposite direction such that the flexible display screen in the unfolded state is wound on the rotating shaft.

The flexible display screen of the portable electronic apparatus provided by the present disclosure can be wound on the rotating shaft. When a large screen is required to be used, the flexible display screen is unfolded, and the positioning mechanism positions the unfolded flexible display screen to facilitate the user's using the large screen. When the large screen is not required to be used, the resetting mechanism drives the rotating shaft to rotate reversely such that the flexible display screen is wound again on the rotating shaft, whereby the flexible display screen can be easily received, occupies less space, and thus can be readily carried by the user.

BRIEF DESCRIPTION OF DRAWINGS

In order to more clearly illustrate technical solutions of embodiments of the present disclosure, the drawings required to be used in the embodiments will be briefly described below. Evidently, the drawings in the following description are some embodiments of the present disclosure, and according to these drawings, those ordinarily skilled in the art can further obtain other drawings without any creative work.

DETAILED DESCRIPTION

Figure 1:
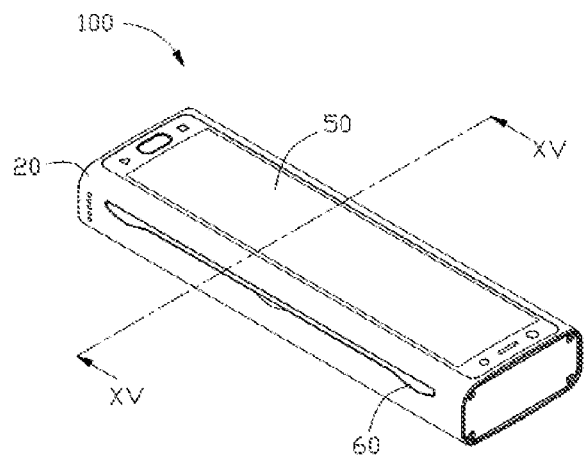
FIG. 1 is a perspective view of a portable electronic apparatus according to an embodiment of the present disclosure.

The technical solutions in the embodiments of the present disclosure will be clearly and completely described below in conjunction with the accompanying drawings in the embodiments of the present disclosure. Obviously, the embodiments described are only some of the embodiments of the present disclosure, rather than all of the embodiments. All other embodiments obtained by those ordinarily skilled in the art without any creative work based on the embodiments of the present disclosure fall within the protection scope of the present disclosure.

In the present disclosure, examples of mobile terminals include, but are not limited to, satellites or cellular telephones; personal communication system (PCS) terminals which can combine cellular radiotelephones with capabilities of data processing, faxing, and data communication; PDA which may include radiotelephones, pagers, Internet/intranet access, Web browsers, notepads, calendars, and/or global positioning system (GPS) receivers; and conventional lap and/or palm receivers or other electronic apparatuses including radiophone transceivers.

According to an aspect of the present disclosure, a flexible display device may include a flexible display screen, a rotating shaft, a resetting mechanism and a positioning mechanism. The flexible display screen may be wound on the rotating shaft. The resetting mechanism may be connected to the rotating shaft and being operable to drive the rotating shaft to rotate to unfold the flexible display screen. The positioning mechanism may be configured to position the unfolded flexible display screen and drive the rotating shaft to rotate in an opposite direction such that the flexible display screen in the unfolded state is wound on the rotating shaft.

In an embodiment, the flexible display screen may be provided with at least one support strap, the at least one support strap being configured to support the flexible display screen and being wound or unfolded on the rotating shaft along with the flexible display screen, the positioning mechanism being configured to position the at least one support strap to cause the flexible display screen to be in an unfolded state.

In an embodiment, the at least one of the support straps may be made of an elastic material, a cross section of the at least one support strap when being wound on the rotating shaft being in a planar shape, a cross section of the at least one support strap after being unfolded being in an arc shape.

In an embodiment, the at least one support strap may be disposed at one of ends of the flexible display screen, the at least one support strap extending along said one end of the flexible display screen.

In an embodiment, the at least one support strap may be sleeved with a flexible thin film to which the flexible display screen is attached.

In an embodiment, the positioning mechanism may comprise a mounting frame, a rotating drum rotatably connected to the mounting frame, and an elastic member connected between the rotating drum and the mounting frame, a plurality of stoppers protruding from the rotating drum, the at least one support strap being provided with a fixing bone position which is retained at one of the stoppers to position the unfolded flexible display screen.

In an embodiment, the mounting frame may define mounting space within which the rotating drum is disposed, an end of the rotating drum away from the rotating shaft being provided with a cam, a plurality of the stoppers being located at an end of the rotating drum away from the cam to pull and unfold the flexible display screen, the fixing bone position skipping over the plurality of the stoppers to push against the cam such that the rotating drum moves along the unfolding direction of the flexible display screen and rotates along an axis line thereof, the elastic member being elastically compressed, the elastic member being elastically reset to drive the rotating drum when a force of pulling of the flexible display screen is released, such that one of the stoppers is retained at the fixing bone position.

In an embodiment, an end face of the cam facing away from the rotating shaft may be provided with a front end gear along the axis line of the rotating drum, and the mounting frame may be provided with a first orientating bevel facing the front end gear, the front end gear comprising a plurality of teeth each provided with a guiding face corresponding to the first orientating bevel, the first orientating bevel slidably pushing against a guiding face of a corresponding tooth of the front end gear to rotate the rotating drum when the rotating drum moves toward the first orientating bevel.

In an embodiment, the mounting frame may define a guiding slot at an inner surface of the mounting space parallel to the axis line of the rotating drum, the rotating drum is slidably received in the guiding slot, an end of the guiding slot facing the front end gear being provided with a first protrusion block on which the first orientating bevel is disposed, the first protrusion block protrudes toward the guiding slot.

In an embodiment, the positioning mechanism may further comprise a connecting shaft on which the rotating drum is sleeved, two ends of the connecting shaft being fixed to two ends of the mounting space of the mounting frame.

In an embodiment, the elastic member may be a spring sleeved on the connecting shaft.

In an embodiment, the stoppers may be arrayed in an annular and spaced manner along the axis line of the rotating drum.

In an embodiment, the resetting mechanism may comprise a rotating shaft resetting member and a positioning member, the rotating shaft resetting member being connected between the positioning member and the rotating shaft.

In an embodiment, an end of the rotating shaft facing the positioning member may define a rotating hole, the positioning member comprises a connecting shaft extending through the rotating hole, the rotating shaft resetting member being received within the rotating hole and being connected between the rotating shaft and the connecting shaft.

In an embodiment, the rotating shaft resetting member may be a roll-up spring, a first end of the roll-up spring being connected to the connecting shaft, a second end of the roll-up spring being connected to the rotating shaft.

According to another aspect of the present disclosure, a portable electronic apparatus may include a housing and a mainboard disposed within the housing. The portable electronic apparatus may further include a flexible display device which comprises a flexible display screen, a rotating shaft, a resetting mechanism and a positioning mechanism. The flexible display screen may be wound on the rotating shaft; the resetting mechanism may be connected to the rotating shaft; the resetting mechanism may be operable to drive the rotating shaft to rotate to unfold the flexible display screen; the positioning mechanism may be configured to position the unfolded flexible display screen; and the resetting mechanism may be further operable to drive the rotating shaft to rotate in an opposite direction such that the flexible display screen in the unfolded state is wound on the rotating shaft. The flexible display device may be mounted on the housing, and the flexible display screen may be electrically connected to the mainboard.

In an embodiment, one of sidewalls of the housing may define a strip-shaped slot, the strip-shaped slot being in communication with receiving space of the housing within which the rotating shaft of the flexible display device is received, the flexible display screen passing from the strip-shaped slot through the housing, an end of the flexible display screen away from the rotating shaft being provided with a stop bar capable of being retained on an outer surface of the housing.

In an embodiment, two opposite ends of the housing are each provided with a positioning means, two opposite ends of the rotating shaft being rotatably connected to the two positioning means.

In an embodiment, the positioning mechanism may be disposed at one of the positioning means, and the resetting mechanism may be disposed between one of the positioning means and the rotating shaft.

In an embodiment, the housing may be further provided with a main display screen electrically connected to the mainboard.

According to still another aspect of the present disclosure, a driving mechanism of a flexible display screen may include a rotating shaft with first and second caps engaged with the two opposite ends of the rotating shaft to seal two opposite openings of the rotating shaft. A reset device may be configured to drive the rotating shaft to rotate to unfold the flexible display screen, the reset device may include a connecting shaft and a roll-up spring. The connecting shaft is configured to extend through the first cap and fixed on one corresponding end of the rotating shaft, the roll-up spring being received in the one corresponding end of the rotating shaft, one end of the roll-up spring being embedded in a free end of the connecting shaft, the other end of the roll-up spring fixed on the rotating shaft. A fixing device may be fixed on the first cap and configured to fix the unfolded flexible display screen and drive the rotating shaft to rotate in an opposite direction such that the flexible display screen in the unfolded state is wound on the rotating shaft.

Figure 2:
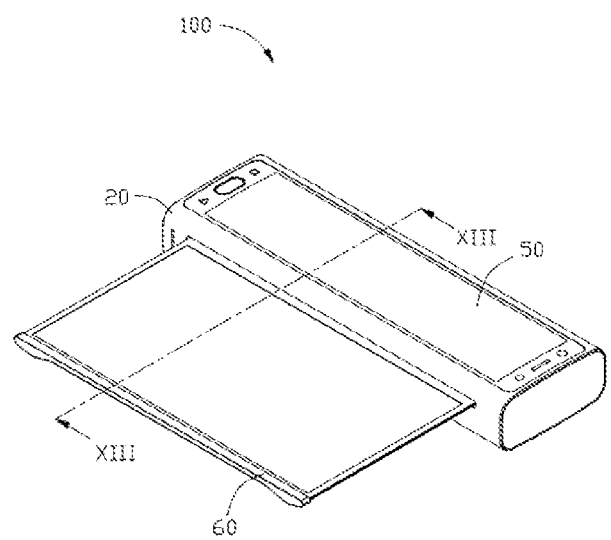
FIG. 2 is a perspective view of an unfolded flexible display screen of the portable electronic apparatus of FIG. 1.
Figure 3:
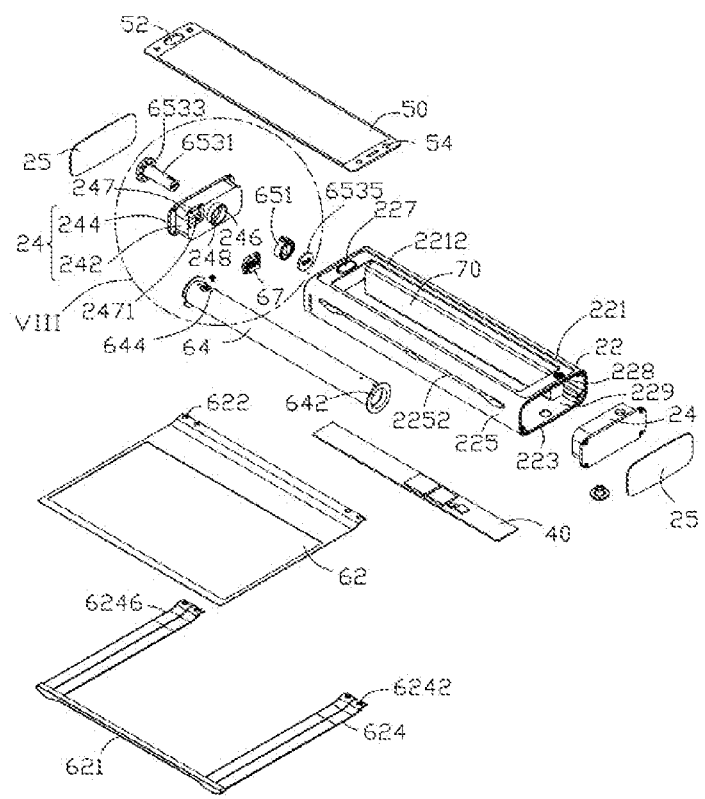
FIG. 3 is an exploded view of the portable electronic apparatus of FIG. 2.
Figure 4:
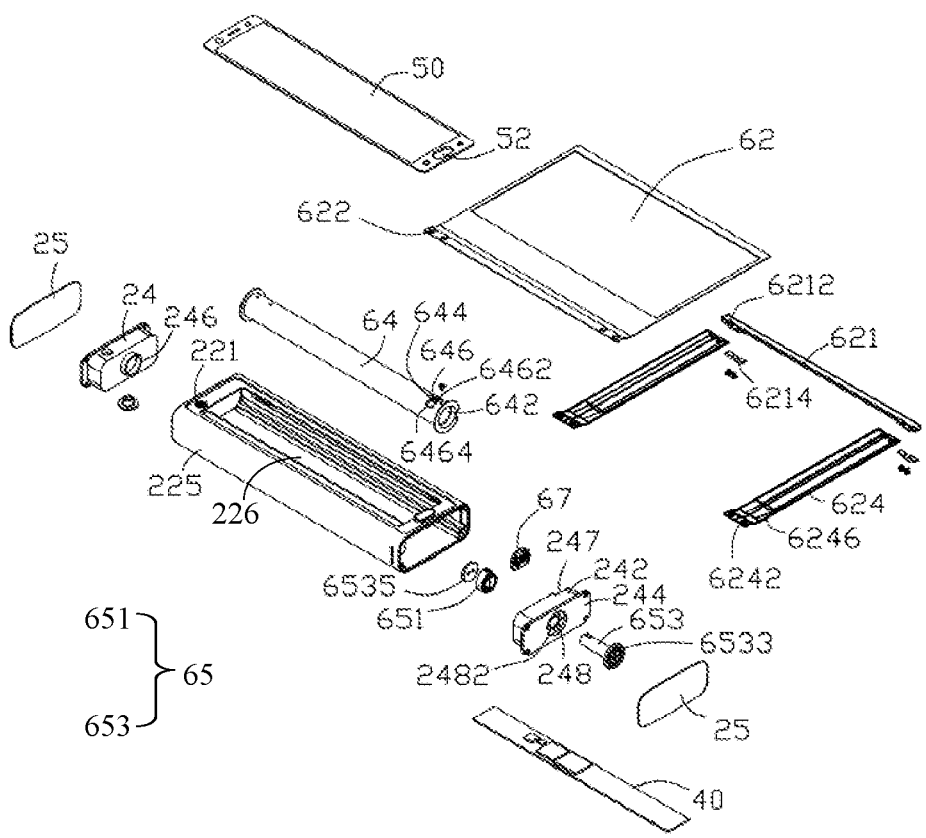
FIG. 4 is an exploded view of another viewing angle of the portable electronic apparatus of FIG. 3.

Reference is made to FIGS. 1 to 4. FIG. 1 is a perspective view of a portable electronic apparatus according to an embodiment of the present disclosure. FIG. 2 is a perspective view of an unfolded flexible display screen of the portable electronic apparatus of FIG. 1. FIG. 3 is an exploded view of the portable electronic apparatus of FIG. 2. FIG. 4 is a perspective view of another viewing angle view of the portable electronic apparatus of FIG. 2. The present disclosure provides a portable electronic apparatus 100. The portable electronic apparatus 100 may comprises a housing 20, a mainboard 40 disposed within the housing 20, a main display screen 50 disposed on a front face of the housing 20, a flexible display device 60 and a battery 70 disposed within the housing 20. The flexible display device 60 may include a flexible display screen 62, a rotating shaft 64, a resetting mechanism 65, and a positioning mechanism 67. The flexible display screen 62 may be wound on the rotating shaft 64, and the resetting mechanism 65 may be connected to the rotating shaft 64. The flexible display screen 62 may be drawn to drive the rotating shaft 64 to rotate to unfold the flexible display screen 62. The positioning mechanism 67 is configured to position the unfolded flexible display screen 62. The resetting mechanism 65 is configured to drive the rotating shaft 64 to rotate reversely such that the flexible display screen 62 can be wound on the rotating shaft 64. Both the main display screen 50 and the flexible display screen 62 are electrically connected to the mainboard 40. The battery 70 supplies electric power to the mainboard 40, the main display screen 50 and the flexible display screen 62.

In this embodiment, the mobile terminal 100 is a mobile phone. The front face of the housing 20 refers to a light-emitting face of the main display screen 50. A back face of the housing 20 refers to a face facing away from the main display screen 50.

The flexible display screen 62 of the flexible display device 60 of the portable electronic apparatus 100 according to the present disclosure is wound on the rotating shaft 64. When a large screen is required to be used, the flexible display screen 62 is pulled outward to make it unfolded, and the positioning mechanism 67 positions the unfolded flexible display screen 62 to facilitate the user's using the large screen. When the large screen is not required to be used, the resetting mechanism 65 drives the rotating shaft 64 to rotate reversely such that the flexible display screen 62 is wound again on the rotating shaft 64, whereby the flexible display screen 62 is received in the housing 20, occupies less space, and thus can be readily carried by the user.

In other embodiments, the resetting mechanism 65 is operable to drive the rotating shaft 64 to rotate to unfold the flexible display screen 62. For example, the resetting mechanism 65 is a driving motor electrically connected to the mainboard 40. The mainboard is configured to control the resetting mechanism 65 to drive the rotating shaft 64 to rotate to unfold the flexible display screen 62.

In other embodiments, the resetting mechanism 65 may be further operable to drive the rotating shaft 64 to rotate in an opposite direction, such that the flexible display screen 62 in the unfolded state is wound on the rotating shaft 64.

As shown in FIG. 3 and FIG. 4, the housing 20 may include an enclosure 22 and two positioning means 24 disposed on two opposite ends of the enclosure 22. The enclosure 22 is a rectangular frame, comprising a top wall 221, a back plate 223 and two opposite sidewalls 225. The top wall 221, the back plate 223 and the two sidewalls 225 together enclose a receiving space 226. The electronic components such as the mainboard 40, the flexible display device 60 and the battery 70 are received in the receiving space 226. An outer surface of the top wall 221 defines a mounting slot 2212 for mounting the main display screen 50, and an intermediate portion of the mounting slot 2212 is in communication with the receiving space 226. An end of the top wall 221 is provided with a fingerprint recognizer 227 electrically connected to the mainboard 40. An opposite end of the top wall 221 is provided with a camera 228 electrically connected to the mainboard 40. Two opposite end faces of the enclosure 22 each define a positioning hole 229 in communication with the receiving space 226. The two positioning means 24 can be respectively engaged in the two positioning holes 229. An intermediate portion of one of the sidewalls 225 defines a strip-shaped slot 2252 in communication with the receiving space 226. The strip-shaped slot 2252 extends along a direction of a length of the sidewall 225. The flexible display screen 62 passes through the strip-shaped slot 2252 and is received within the enclosure 22.

Each of the positioning means 24 includes a block 242 received within a corresponding positioning hole 229, and a positioning sheet 244 disposed on a side of the block 242 facing away from the enclosure 22. A circumference of the positioning sheet 244 protrudes out of the block 242, and a protruding portion of the circumference of the positioning sheet 244 is connected to an end face of the enclosure 22. A cylinder 246 protrudes from a side face of the block 242 facing away from the positioning sheet 244. When the two positioning means 24 are each engaged in the two positioning holes 229 of the enclosure 22, center lines of the two cylinders 246 are on a same straight line. A side face of the block 242 of one of the positioning means 24 facing away from the corresponding positioning sheet 244 defines a mounting opening 247. A plurality of positioning posts 2471 protrudes from an inner surface of the mounting opening 247. A through hole 248 in communication with the cylinder 246 is defined in the positioning means 24 along the center line of the cylinder 246. An outer surface of the positioning sheet 244 is provided with a groove 2482 around the through hole 248.

The housing 20 further includes two cover plates 25 respectively covering on the outer surfaces of the positioning sheets 244 of the two positioning means 24.

The main display screen 50 is engaged in the mounting slot 2212 of the housing 20. An end of the main display screen 50 defines a fingerprint recognition hole 52 corresponding to the fingerprint recognizer 227, and the other end of the main display screen 50 defines a light entrance hole 54 corresponding to the camera 228. The main display screen 50 is further provided with a light-induced hole, a microphone hole, an earphone hole, and the like, as well as various operating icons, key-press icons or the like. The main display screen 50 may be a touch screen or a non-touch screen. In the present embodiment, the main display screen 50 is a touch screen.

A lateral side of the flexible display screen 62 is provided with a stop bar 621, i.e., a side of the flexible display screen 62 away from the rotating shaft 64 is provided with the stop bar 621 which can be retained on an outer surface of the housing 20 around the strip-shaped slot 2252. Two ends of a side of the flexible display screen 62 away from the stop bar 621 each define a plurality of connecting holes 622. The flexible display screen 62 is provided with at least one support strap 624 which is configured to support the flexible display screen 62. The support strap 624 is wound or unfolded on the rotating shaft 64 along with the flexible display screen 62. The positioning mechanism 67 positions the support strap 624 to cause the flexible display screen 62 to be in an unfolded state.

In the present embodiment, two opposite ends of the back face of the flexible display screen 62 are each provided with one said support strap 624, and each of the support straps 624 extends along a corresponding end of the flexible display screen 62, i.e., the support strap 624 extends in the unfolding direction of the flexible display screen 62. Ends of the two supporting straps 624 away from the rotating shaft 64 are fixed to two opposite ends of the stop bar 621, respectively. Specifically, two ends of the side face of the stop bar 621 facing two of the support straps 624 each define a mounting slot 6212. An end of each of the support straps 624 away from the rotating shaft 64 is received in a corresponding mounting slot 6212 and is engaged within the mounting slot 6212 via a pressing block 6214. A plurality of screws pass through the stop bar 621, the support strap 624 and the pressing block 6214 to further secure connection between the support strap 624 and the stop bar 621. The support strap 624 on a side adjacent to the positioning mechanism 67 is convexly provided with a fixing bone position 6246 located on an end away from the stop bar 621.

Figure 5:
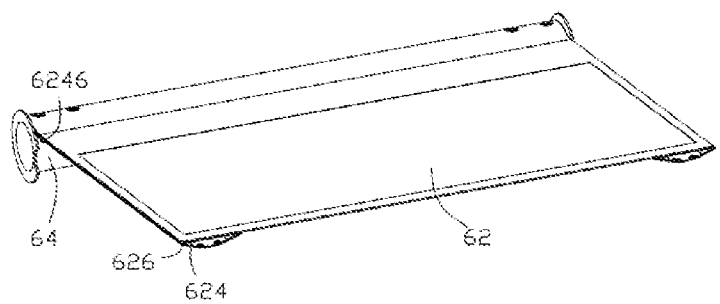
FIG. 5 is a structural view of a flexible display screen, a support strap and a rotating shaft of the portable electronic apparatus according to the present disclosure.
Figure 6:
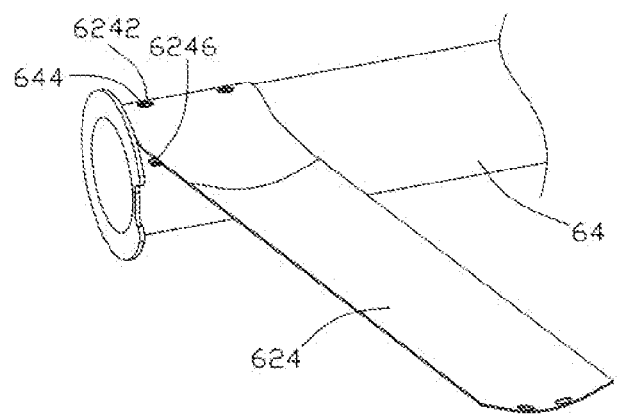
FIG. 6 is a partially enlarged view of FIG. 5 without the flexible display screen.
Figure 7:
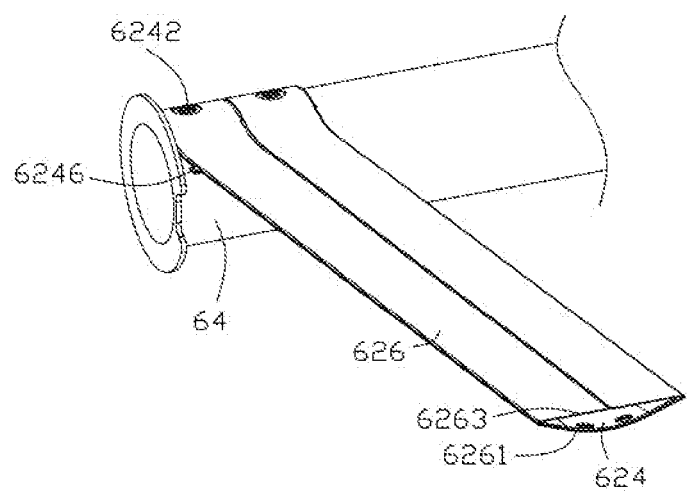
FIG. 7 is a structural view of the support strap of FIG. 6 after being sleeved with a flexible thin film.

Reference is made to FIGS. 5 to 7. FIG. 5 is an assembled view of a flexible display screen, a support strap and a rotating shaft of the portable electronic apparatus according to the present disclosure. FIG. 6 is a partially enlarged view of FIG. 5 without the flexible display screen. FIG. 7 is a perspective view of the support strap of FIG. 6 after being sleeved with a flexible thin film. Each of the support straps 624 is made of an elastic material. When the support strap 624 is wound on the rotating shaft 64, a cross section of the support strap 624 is in a planar shape; and when the support strap 624 is unfolded, its cross section is in an arc shape. A plurality of connecting holes 6242 are defined on an end of each of the support straps 624 away from the stop bar 621. In this embodiment, an arc opening of the cross section of each of the support straps 624 after being unfolded is oriented toward the flexible display screen 62 which the support strap 624 can support.

Each of the support straps 624 is sleeved with a flexible thin film 626. The flexible thin film 626 includes a thin-film strip 6261 attached to an arc outer surface of the support strap 624, and two extending thin-film strips 6263 extending from two opposite sides of the thin-film strip 6261 toward the intermediate portion of the support strap 624. The thin-film strip 6261 and the arc outer surface of the support strap 624 are secured by glue. The flexible display screen 62 is attached to the flexible thin film 626. Specifically, the two extending thin-film strips 6263 are connected to the back face of the flexible display screen 62 by back-adhesive.

Figure 8:
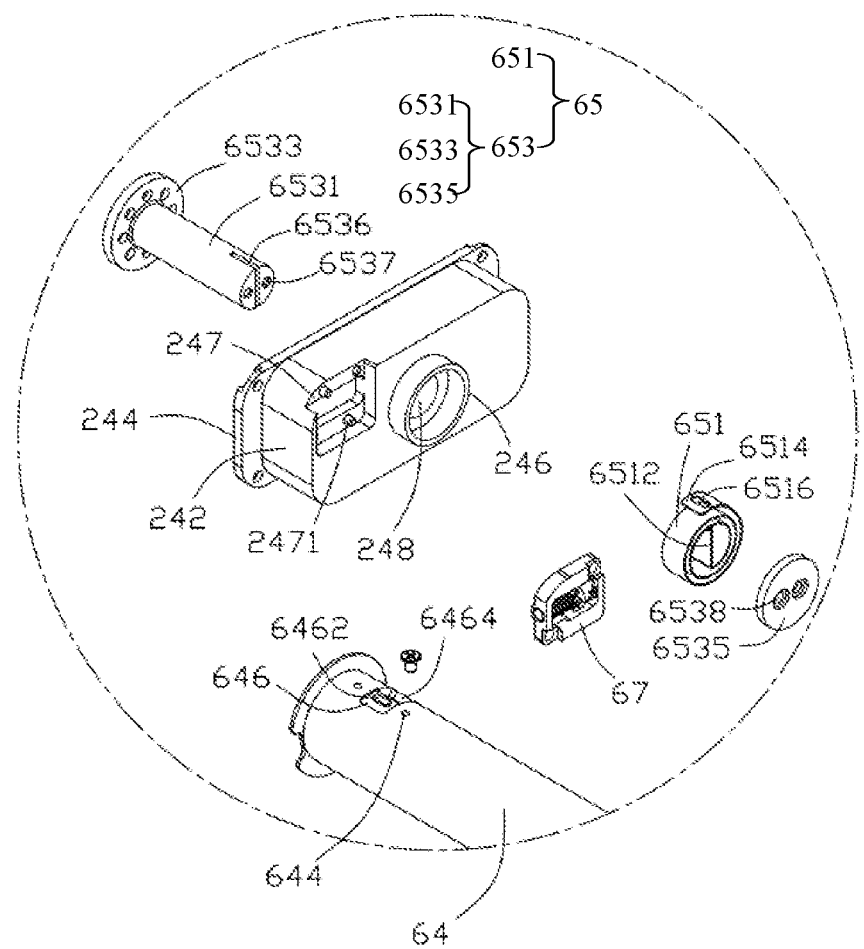
FIG. 8 is an enlarged view of VIII of FIG. 3.

As shown in FIG. 3, FIG. 4 and FIG. 8, FIG. 8 is an enlarged view of VIII of FIG. 3. Two opposite end faces of the rotating shaft 64 each axially define a rotating hole 642; and two opposite ends of a circumferential face of the rotating shaft 64 each define two spaced fixing holes 644. One of ends of the circumferential face of the rotating shaft 64 defines a positioning slot 646 between the two fixing holes 644; and the positioning slot 646 extends along the circumferential surface of the rotating shaft 64. The rotating shaft 64 is convexly provided with a positioning block 6462 on an inner surface of the positioning slot 646, and the positioning block 6462 is located between the corresponding two fixing holes 644. An end of the inner surface of the positioning slot 646 away from the positioning block 6462 defines a through hole 6464 in communication with a corresponding rotating hole 642.

The resetting mechanism 65 includes a rotating shaft resetting member 651 and a positioning member 653. The rotating shaft resetting member 651 is connected between the positioning member 653 and the rotating shaft 64. The rotating shaft resetting member 651 is configured to drive the rotating shaft 64 to rotate reversely such that the flexible display screen 62 is wound on the rotating shaft 64. In the present embodiment, the rotating shaft resetting member 651 is a roll-up spring which includes a first end 6512 and a second end 6514. The first end 6512 is located inside the roll-up spring; and the second end 6514 is located outside the roll-up spring. The first end 6512 is a positioning plate; and the second end 6514 defines a positioning hole 6516 corresponding to the positioning block 6462.

The positioning member 653 includes a connecting shaft 6531, a mounting plate 6533 convexly provided on an end of the connecting shaft 6531, and a connecting plate 6535.

The connecting shaft 6531 can be inserted through the through hole 248 into a corresponding rotating hole 642 of the rotating shaft 64. The mounting plate 6533 can be fixed to the groove 2482 of the corresponding positioning means 24. An end face of the connecting shaft 6531 away from the mounting plate 6533 is provided with a recess 6536 and a plurality of connecting holes 6537. The connecting plate 6535 defines a plurality of through holes 6538 corresponding to the plurality of connecting holes 6537.

Figure 9:
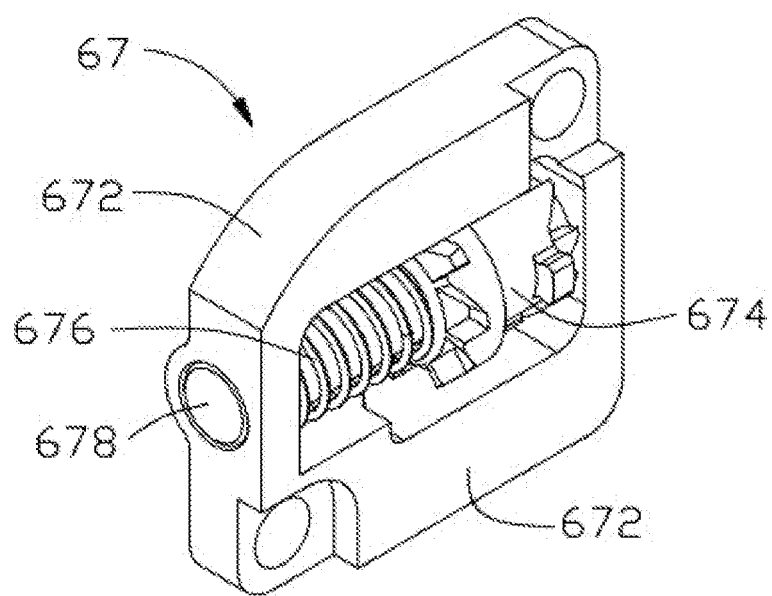
FIG. 9 is a perspective view of a positioning mechanism of a flexible display device according to the present disclosure.
Figure 10:
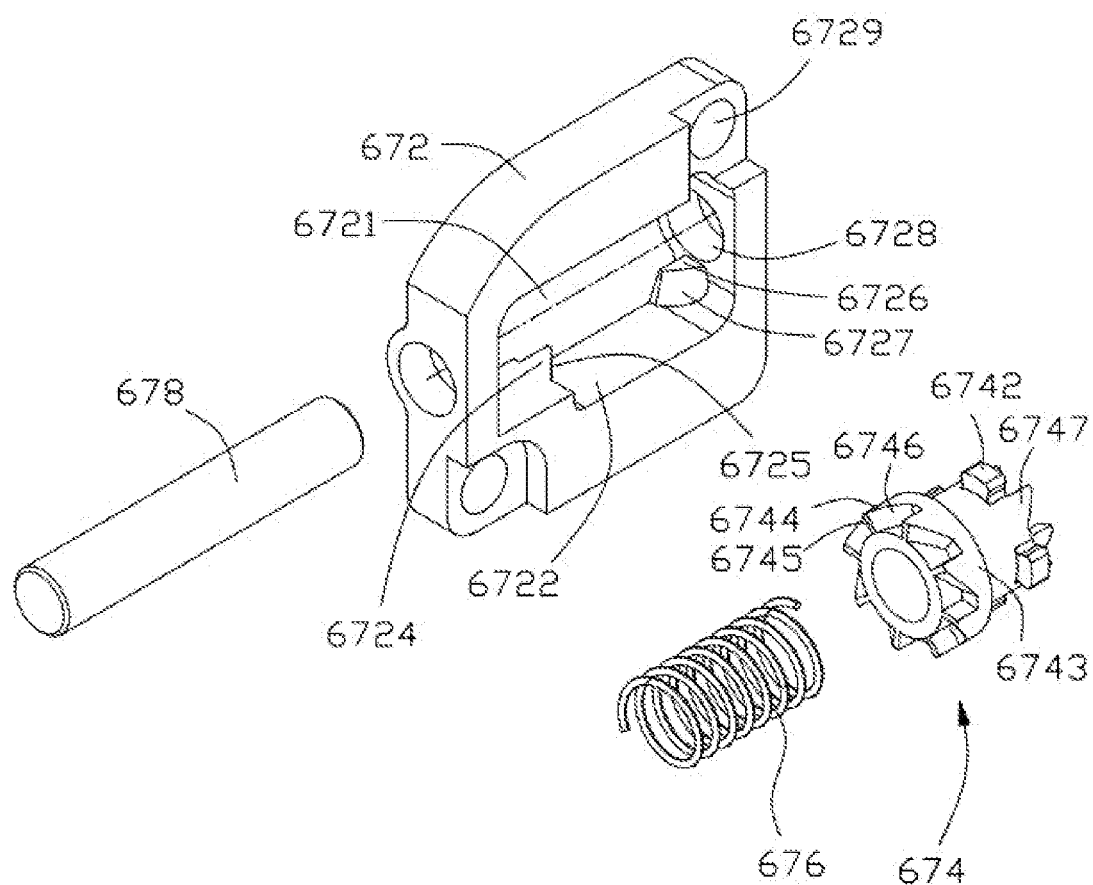
FIG. 10 is an exploded view of FIG. 9
Figure 11:
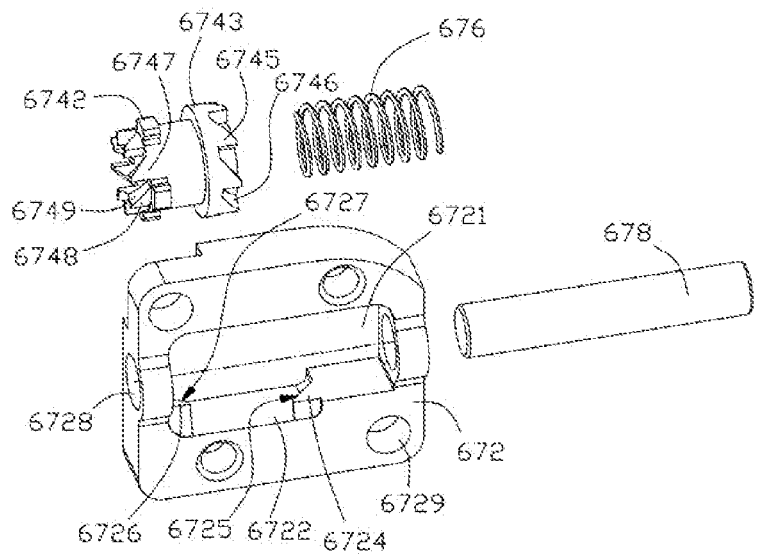
FIG. 11 is a structural view of another viewing angle view of FIG. 10.
Figure 12A:
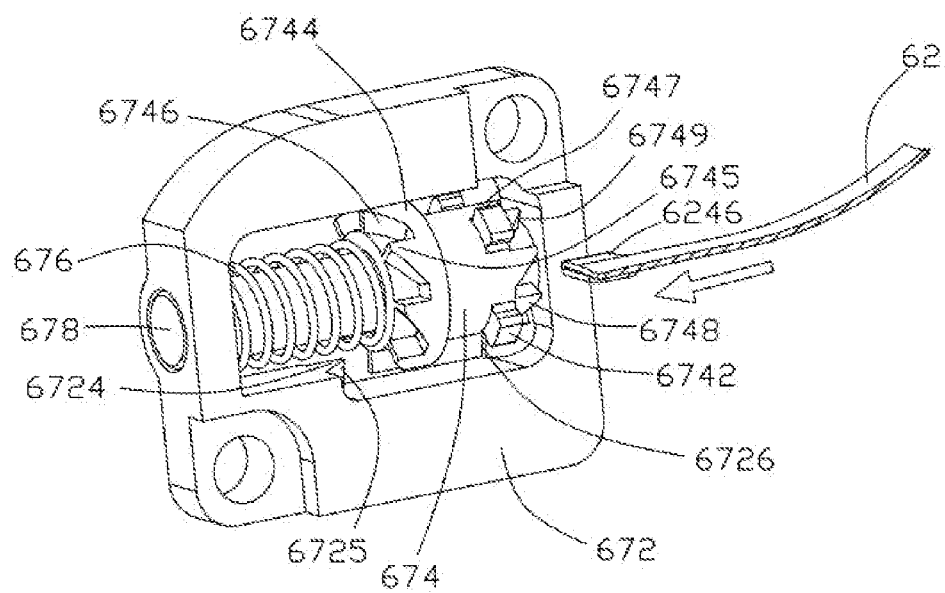
FIGS. 12A-12F are views showing a process in which a positioning mechanism of a flexible display device positions a flexible display screen according to the present disclosure.
Figure 12B:
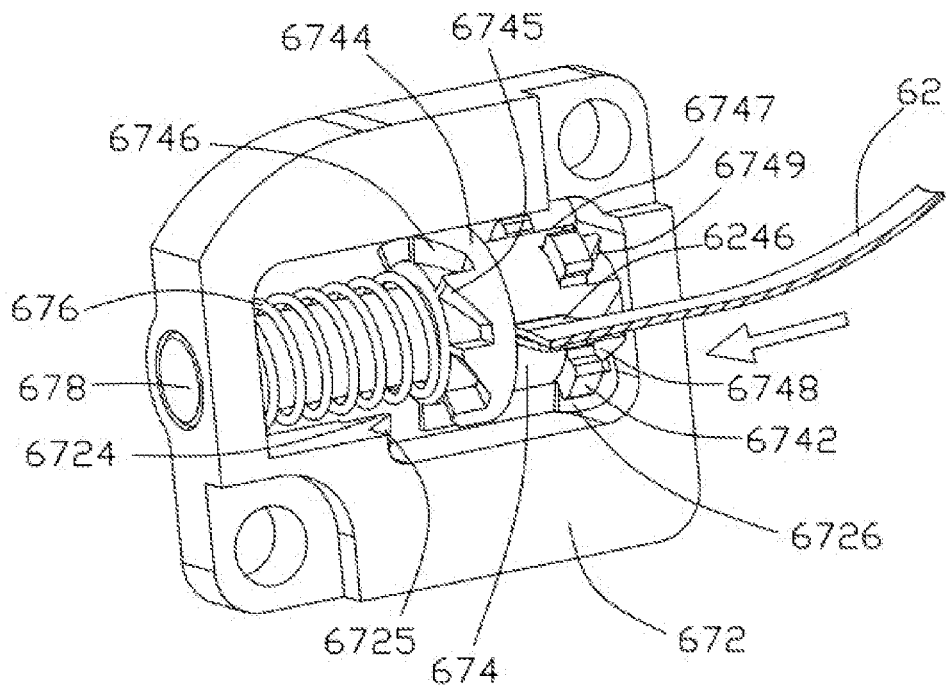
Figure 12C:
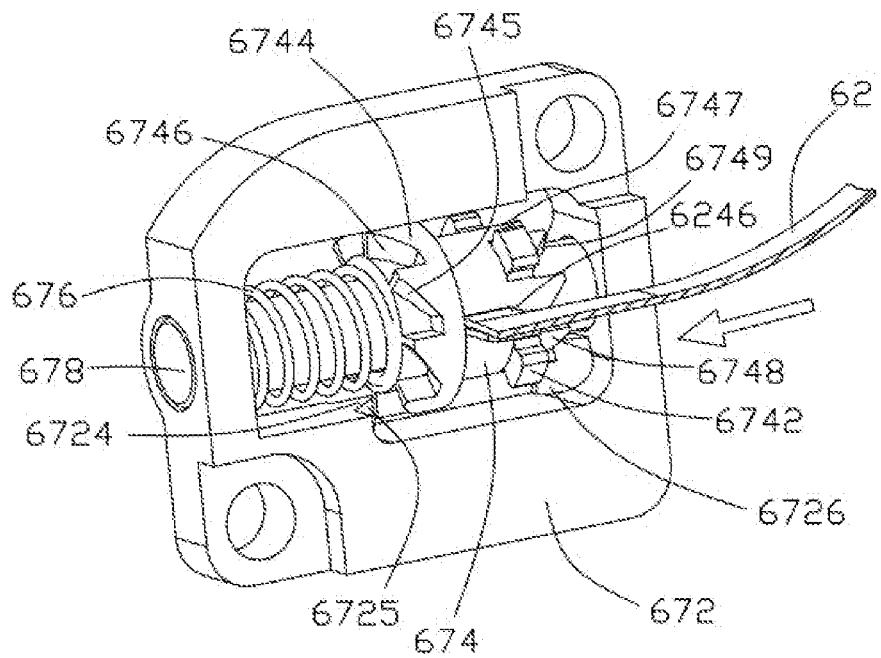
Figure 12D:
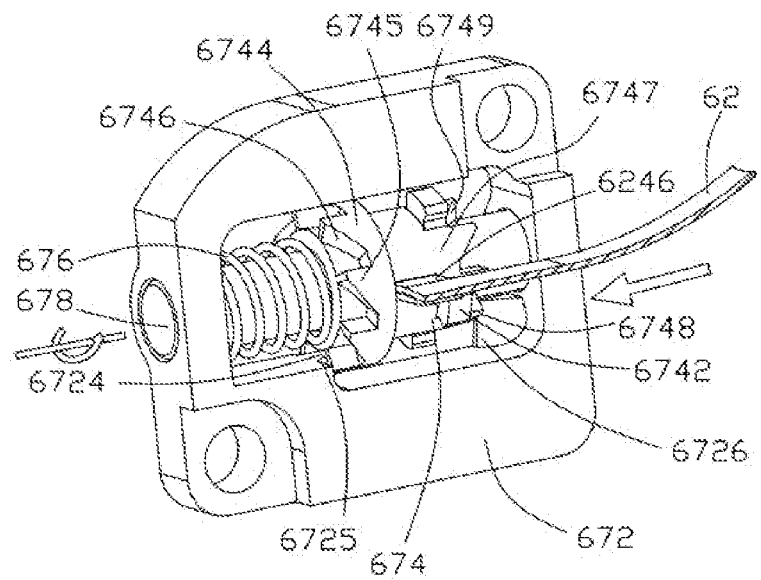
Figure 12E:
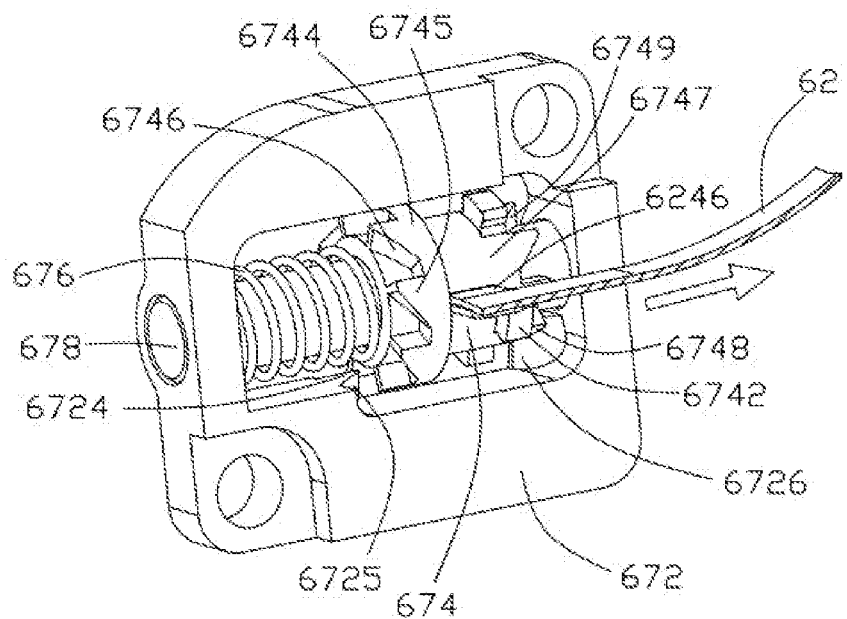
Figure 12F:
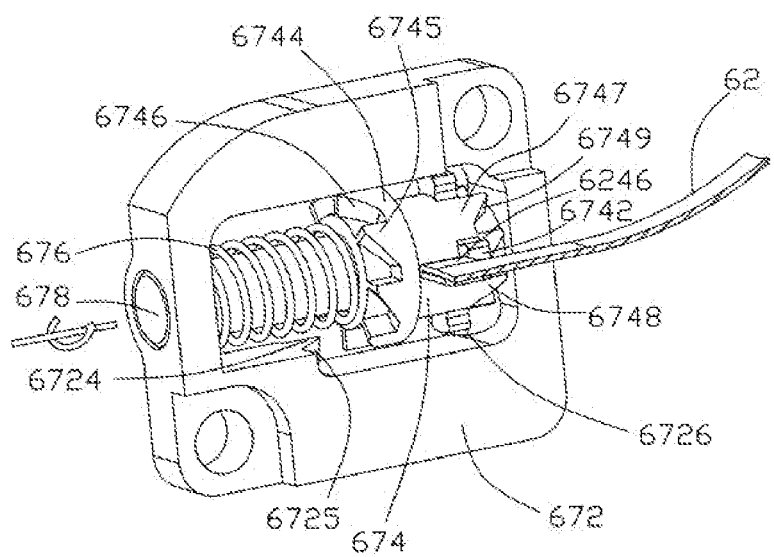

Referring to FIGS. 9 to 11, FIG. 9 is a perspective view of a positioning mechanism of a flexible display device according to the present disclosure; FIG. 10 is an exploded view of FIG. 9; and FIG. 11 is a structural diagram of another viewing angle of FIG. 10. The positioning mechanism 67 includes a mounting frame 672, a rotating drum 674 rotatably connected to the mounting frame 672, an elastic member 676 located on an end of the rotating drum 674, and a connecting shaft 678. The rotating drum 674 is convexly provided with a plurality of stoppers 6742 spaced apart from each other, and the fixing bone position 6246 of the support strap 624 can pass through spacing between the stoppers 6741 and is retained at one of the stoppers 6742 to position the unfolded flexible display screen 62. The rotating drum 674 is connected to the mounting frame 672 via the connecting shaft 678, and the elastic member 676 is disposed between the mounting frame 672 and the rotating drum 674.

The mounting frame 672 can be received within the mounting opening 247 of the positioning means 24, and an intermediate portion of the mounting frame 672 defines a mounting space 6721 which extends along the unfolding direction of the flexible display screen 62. The rotating drum 674 is disposed within the mounting space 6721. A medial face of the mounting space 6721 parallel to the axis line of the rotating drum 674 defines a guiding slot 6722 within which the rotating drum 674 is slidably received. An end of the guiding slot 6722 is convexly provided with a first protrusion block 6724, that is, the first protrusion block 6724 protrudes toward the guiding slot 6722. A side of the first protrusion block 6724 facing the rotating drum 674 is provided with a first orientating bevel 6725. The other end of the guiding slot 6722 is convexly provided with a second protrusion block 6726, that is, the second protrusion block 6726 protrudes towards the guiding slot 6722, and a side of the second protrusion block 6726 facing the rotating drum 674 is provided with a second orientating bevel 6727. The mounting frame 672 defines a pair of shaft holes 6728 on two opposite ends of the mounting space 6721. The axis line of a pair of the shaft holes 6728 coincides with the axis line of the rotating drum 674 when the rotating drum 674 is mounted within the mounting space 6721 of the mounting frame 672. A plurality of clamping holes 6729 are defined on a circumference of the mounting frame 672.

An end of the rotating drum 674 away from the rotating shaft 64 may be provided with a cam 6743, and a plurality of the stoppers 6742 are located on a circumferential surface of an end of the rotating drum 674 away from the cam 6743. An end face of the cam 6743 facing away from the stoppers 6742 is provided with a front end gear 6744 along the axis line of the rotating drum 674. The front end gear 6744 includes a plurality of teeth 6745 each provided with a guiding face 6746 corresponding to the first orientating bevel 6725. When the rotating drum 674 moves away from the rotating shaft 64, i.e., when the rotating drum 674 moves towards the first protrusion block 6724, the first orientating bevel 6725 slidably pushes against the guiding face 6746 of the corresponding tooth 6745 of the front end gear 6744 to rotate the rotating drum 674. An end face of the rotating drum 674 facing away from the cam 6743 is provided with a rear end gear 6747, that is, an end face of the rotating drum 674 facing the rotating shaft 64 is provided with the rear end gear 6747 which includes a plurality of teeth 6748, and each of the teeth 6748 is provided with a guiding face 6749 corresponding to the second orientating bevel 6727. When the rotating drum 674 moves away from the rotating shaft 64, i.e., when the elastic member 676 is elastically reset to drive the rotating drum 674 to move toward the rotating shaft 64, the second orientating bevel 6727 slidably pushes against the corresponding guiding face 6749 of the rear end gear 6747 to rotate the rotating drum 674.

The elastic member 676 is disposed between the cam 6743 of the rotating drum 674 and the mounting frame 672. The rotating drum 674 is rotatably and slidably sleeved on the connecting shaft 678. Two ends of the connecting shaft 678 are fixed to two ends of the mounting space 6721 of the mounting frame 672, that is, the two ends of the connecting shaft 678 are fixed within a pair of shaft holes 6728 of the mounting frame 672.

In the present embodiment, a plurality of the stoppers 6742 are arrayed in an annular and spaced manner along the axis line of the rotating drum 674; and the elastic member 676 is a spring sleeved on the connecting shaft 678 and located on the front end of the cam 6743.

When the positioning mechanism 67 is assembled, the rotating drum 674 is sleeved on the connecting shaft 678, and the elastic member 676 is sleeved on the connecting shaft 678 and is pressed against an end of the rotating drum 674 provided with the cam 6743. Then, the rotating drum 674, the elastic member 676 and the connecting shaft 678 are received within the mounting space 6721, and the rotating drum 674 is located within the guiding slot 6722. Subsequently, two ends of the connecting shaft 678 are respectively fixed within the pair of shaft holes 6728 of the mounting frame 672. At this time, the front end gear 6744 of the rotating drum 674 corresponds to the first protrusion block 6724, and the rear end gear 6747 corresponds to the second protrusion block 6726. The rotating drum 674 slides along the connecting shaft 678 and can rotate.

When the portable electronic apparatus 100 is assembled, the mainboard 40 and the battery 70 are mounted within the housing 20. The positioning mechanism 67 is received within the mounting opening 247 of the corresponding positioning means 24, and a plurality of the positioning posts 2471 are respectively engaged in corresponding clamping holes 6729 of the mounting frame 672 such that the positioning mechanism 67 is fixed on the positioning means 24. The connecting shaft 6531 of the positioning member 653 is configured to pass through the through hole 248 of the positioning means 24 such that the mounting plate 6533 is received within the groove 2482. A first end 6512 of the rotating shaft resetting member 651 is engaged within the recess 6536 of the connecting shaft 6531; the connecting plate 6535 is attached to an end portion of the connecting shaft 6531 and passes through the through holes 6538 of the connecting plate 6535 through two screws respectively to be locked within the corresponding connecting hole 6537, such that the rotating shaft resetting member 651 is sleeved on the connecting shaft 6531. The rotating shaft 64 is disposed within inner space of the housing 20, and the two positioning means 24 are respectively inserted into the two positioning openings 229 of the enclosure 22, such that the two cylinders 246 are respectively inserted into the rotating hole 642 of the rotating shaft 64. The connecting shaft 6531 of the positioning member 653 is inserted into the rotating hole 642 on an end of the rotating shaft 64 defining the positioning slot 646, such that a second end 6514 of the rotating shaft resetting member 651 passes through the through hole 6464 to be received within the positioning slot 646; and the positioning block 6462 is engaged within the positioning hole 6516 of the rotating shaft resetting member 651. At this time, the rotating shaft resetting member 651 is connected between the positioning member 653 and the rotating shaft 64. The ends of the two support straps 624 away from the connecting holes 6242 are respectively fixed to two opposite ends of the stop bar 621, and the two support straps 624 are attached to the two opposite ends of a bottom face of the flexible display screen 62, such that the connecting hole 6242 on each support strap 624 corresponds to a connecting hole 622 on the flexible display screen 62. A side of the flexible display screen 62 away from the stop bar 621 is inserted from the exterior of the enclosure 22 into the strip-shaped slot 2252 until the flexible display screen 62 is disposed on and covers the rotating shaft 64. A plurality of screws respectively pass through the connecting holes 622 of the flexible display screen 62 to be screwed to the corresponding fixing holes 644 of the rotating shaft 64, such that the flexible display screen 62 is connected to the rotating shaft 64; and the flexible display screen 62 presses and covers the second end 6514 of the rotating shaft resetting member 651. The rotating shaft 64 is rotated to cause the flexible display screen 62 to be wound on the rotating shaft 64, and the resetting mechanism 65 rotates along with the rotating shaft 64. The positioning member 653 is fixed on the positioning means 24 by a plurality of screws. At this time, the flexible display screen 62 is wound on the rotating shaft 64; the rotating shaft 64 can rotate along the two cylinders 246; and the stop bar 621 is retained on the outer surface of the strip-shaped slot 2252 of the enclosure 22. The main display screen 50 is then mounted within the mounting slot 2212 of the enclosure 22; and the electronic components such as the main display screen 50, the flexible display screen 62 and the battery 70 etc. are electrically connected to the mainboard 40.

Reference is made to FIGS. 12A-12F. FIGS. 12A-12F are views showing a process in which a positioning mechanism of a flexible display device positions a support strap according to the present disclosure. When the flexible display screen 62 is required to be unfolded, the stop bar 621 is pulled outward to disengage the flexible display screen 62 from the rotating shaft 64 to drive the rotating shaft 64 to rotate, such that the rotating shaft resetting member 651 is elastically deformed. The fixing bone position 6246 on the support strap 624 skips over spacing between the plurality of stoppers 6742 to push against the cam 6743, such that the rotating drum 674 slides toward the elastic member 676 along the unfolding direction of the flexible display screen 62. The elastic member 676 is pressed by the rotating drum 674 to undergo elastic deforming. The guiding face 6746 of one of the teeth 6745 of the front end gear 6744 of the rotating drum 674 slidably pushes against the first orientating bevel 6725 of the first protrusion block 6724 such that the rotating drum 674 rotates along the connecting shaft 678. In this embodiment, the first orientating bevel 6725 slidably pushes against the guiding face 6746 such that the rotating drum 674 rotates by 22.5 degrees in an anticlockwise manner. With an outward pulling force of the stop bar 621 released, the fixing bone position 6246 does not push against the cam 6743, and the rotating shaft resetting member 651 is partially elastically reset to drive the rotating drum 674 to rotate reversely; and the flexible display screen 62 retracts toward the enclosure 22 to drive the fixing bone position 6246 to move towards the rotating shaft 64. Meanwhile, the elastic member 676 is elastically reset to push against the rotating drum 674 to slide backward; and the guiding face 6749 of one of the teeth 6748 of the rear end gear 6747 of the rotating drum 674 slidably pushes against the second orientating bevel 6727 of the second protrusion block 6726 such that the rotating drum 674 rotates along the connecting shaft 678. In this embodiment, the second orientating bevel 6727 slidably pushes against the guiding face 6749 such that the rotating drum 674 rotates by 22.5 degrees in an anti-clockwise manner, until one of the stoppers 6742 on the rotating drum 674 is oriented directly toward the fixing bone position 6246, such that the fixing bone position 6246 is retained on said one stopper 6742.

Figure 13:
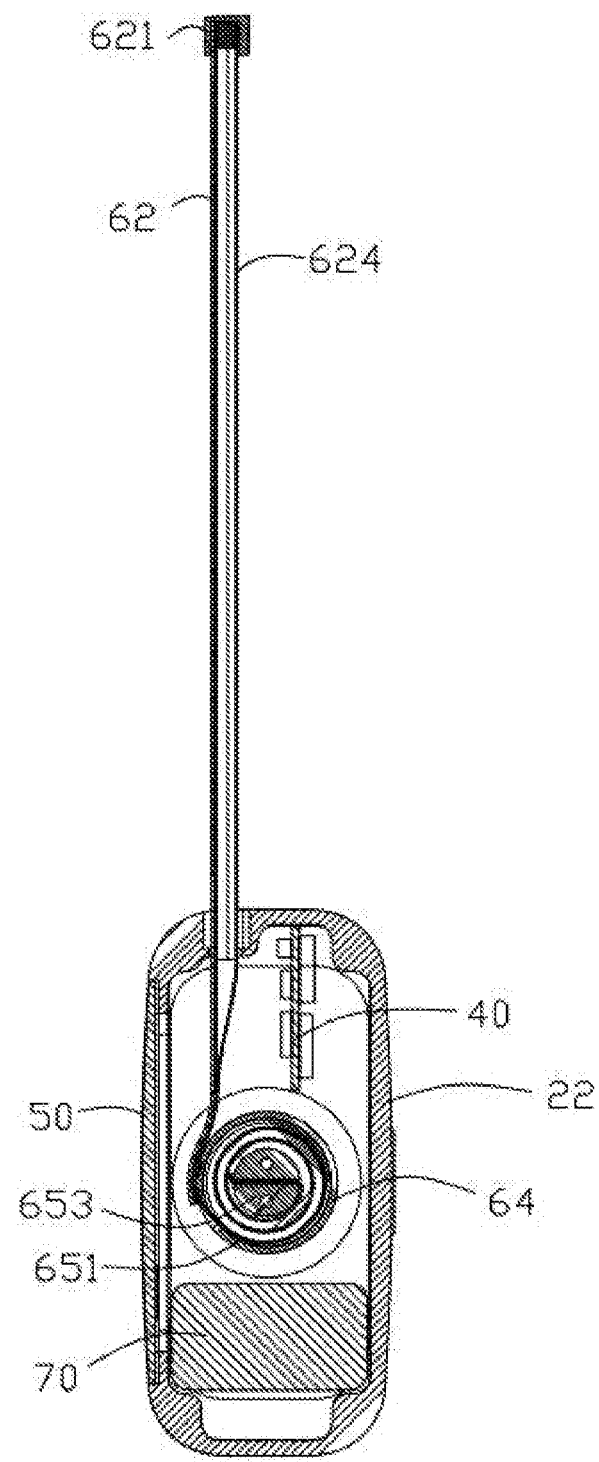
FIG. 13 is a cross-sectional view taken along the XIII-XIII line of FIG. 2.
Figure 14A:
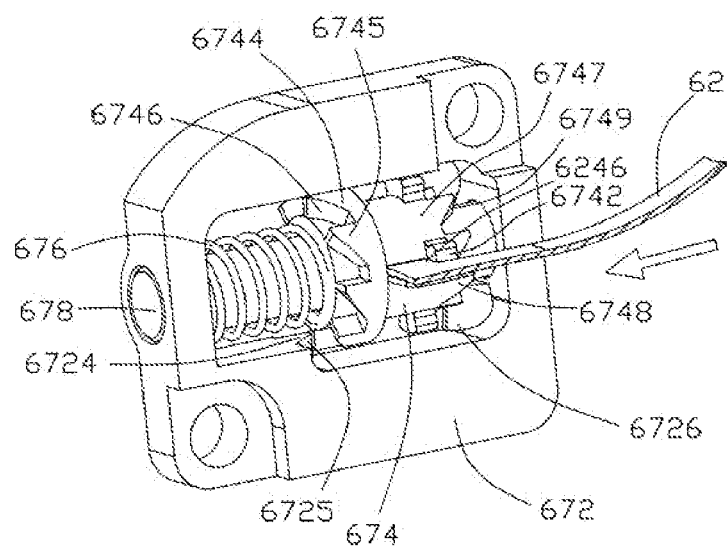
FIGS. 14A-14E are views showing a process in which a positioning mechanism of a flexible display device releases positioning of a support strap according to the present disclosure.
Figure 14B:
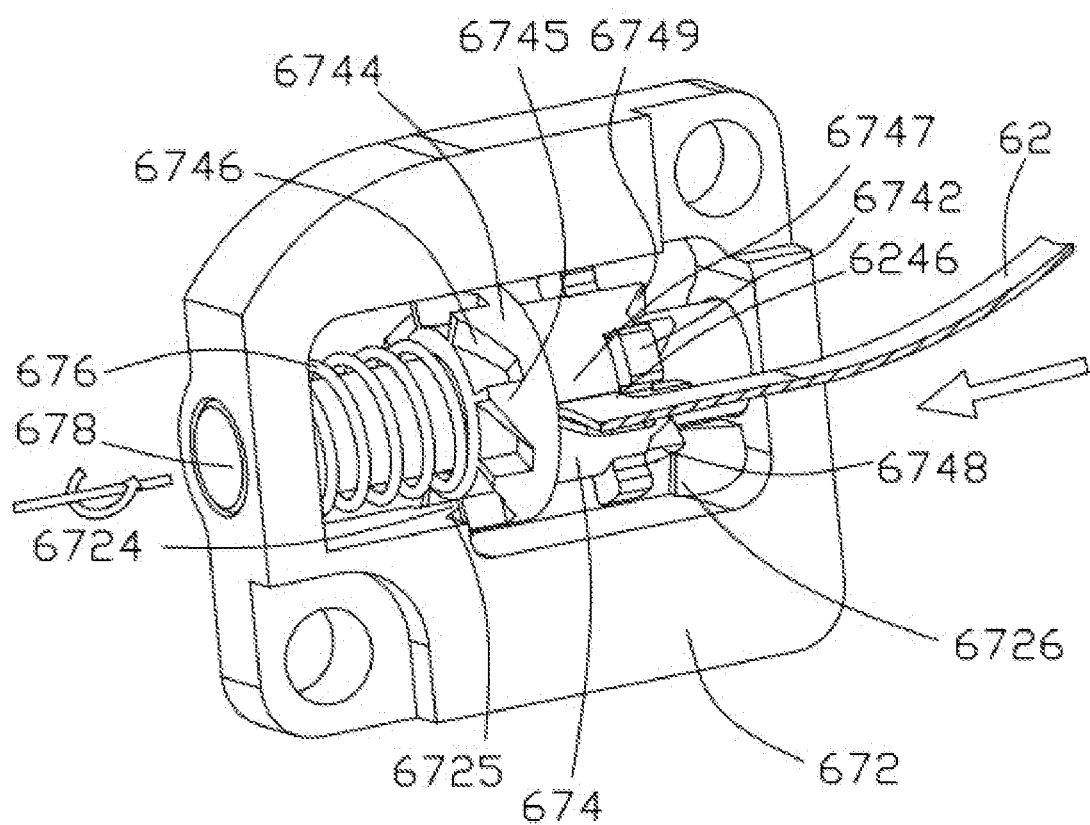
Figure 14C:
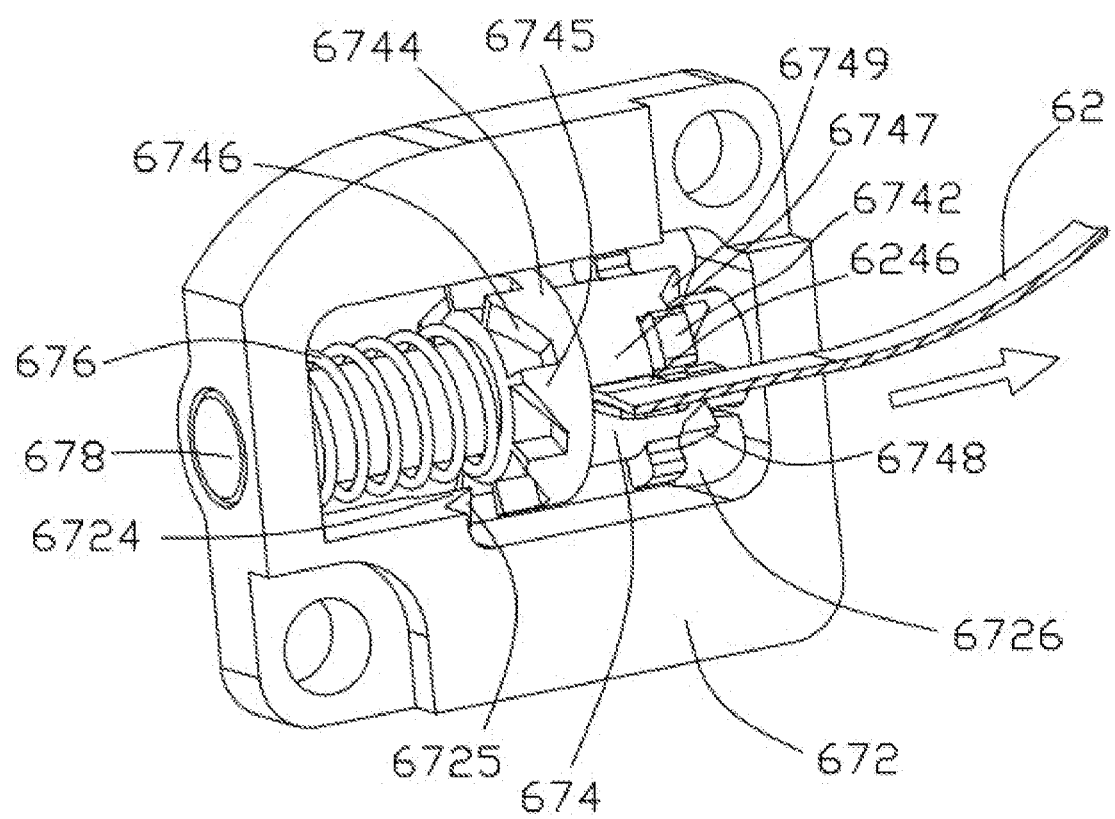
Figure 14D:
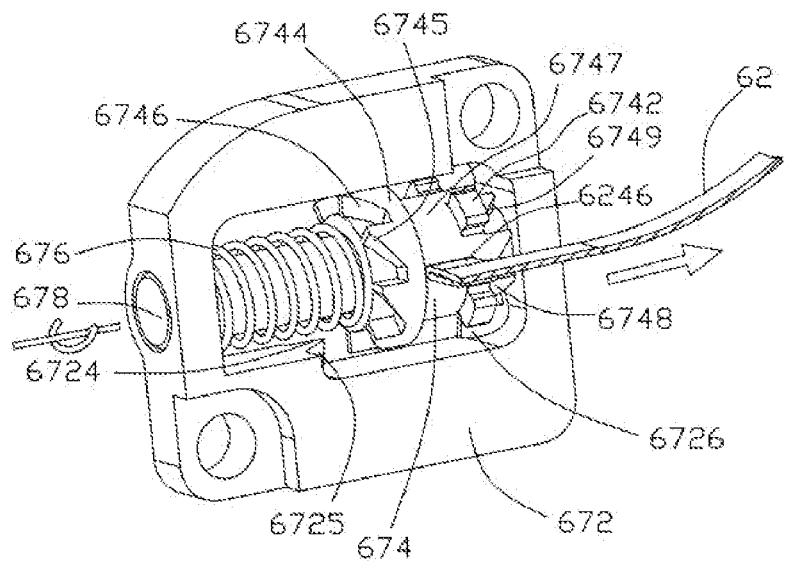
Figure 14E:
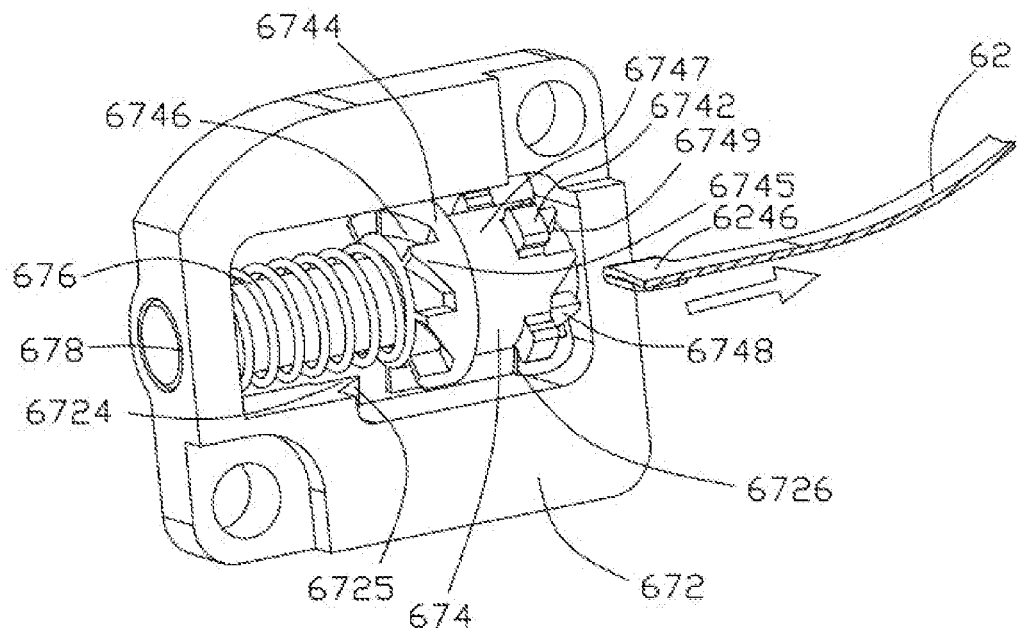

As shown in FIG. 13, the flexible display screen 62 of the electronic apparatus 100 is in an unfolded state. That is, the fixing bone position 6246 is retained at one of the stoppers 6742 to prevent the flexible display screen 62 from being wound on the rotating shaft 64, such that the positioning mechanism 67 positions the flexible display screen 62 to be in an unfolded state, which facilitates the user's using the large screen.

In the present embodiment, after the rotating drum 674 is required to be rotated twice, i.e., after the rotating drum 674 rotates by 45 degrees in an anticlockwise manner, one of the stoppers 6742 of the rotating drum 674 is retained at the fixing bone position 6246.

In other embodiments, the rotating drum 674 may be provided only with a front end gear 6744. The front end gear 6744 includes a plurality of teeth each provided with a guiding face. The mounting frame 672 is provided only with a first protrusion block corresponding to the front end gear 6744. The first protrusion block is provided with a first orientating bevel corresponding to a guiding face of each tooth. When the flexible display screen 62 is unfolded outward to drive the fixing bone position 6246 to push against the rotating drum 674 to slide, the guiding face of one of the teeth slidably pushes against the first orientating bevel to rotate the rotating drum 674, until one of the stoppers 6742 on the rotating drum 674 is oriented directly toward the fixing bone position 6246. With an outward pulling force of the flexible display screen 62 released, the elastic member 676 is elastically reset to push against the rotating drum 674 to retreat. The rotating shaft resetting member 651 drives the flexible display screen 62 to move toward the rotating shaft 64, such that the fixing bone position 6246 is retained on one of the stoppers 6742. That is, as long as the rotating drum 674 rotates once, one of the stoppers 6742 can be retained at the fixing bone position 6246.

In other embodiments, the rotating drum 674 may also be provided only with a rear end gear 6747, i.e., the cam 6743 is not provided with a front end gear 6744. The rear end gear 6747 includes a plurality of teeth each provided with a guiding face. The mounting frame 672 may also be provided only with a second protrusion block corresponding to the rear end gear 6747. The second protrusion block is provided with a second orientating bevel corresponding to a guiding face of each tooth. When the flexible display screen 62 is unfolded outward to drive the fixing bone position 6246 to push against the rotating drum 674 to slide, the elastic member 676 is elastically deformed, and then the outward pulling force of the stop bar 621 is released. The fixing bone position 6246 does not push against the cam 6743, and the rotating shaft resetting member 651 is partially elastically reset to drive the rotating drum 674 to rotate reversely, so that the flexible display screen 62 retracts toward the enclosure 22 to drive the fixing bone position 6246 to move toward the rotating shaft 64. Meanwhile, the elastic member 676 is elastically reset to push against the rotating drum 674 to slide backward, and the sliding guide surface of one of the teeth of the rear end gear 6747 of the rotating drum 674 slidably pushes against the second orienting bevel of the second protrusion block, such that the rotating drum 674 rotates along the connecting shaft 678 until the fixing bone position 6246 is retained on one of the stoppers 6742. That is, as long as the rotating drum 674 rotates once, one of the stoppers 6742 can be retained at the fixing bone position 6246.

In other embodiments, the rotating drum 674 can also be configured to rotate in a clockwise manner.

In other embodiments, the rotating drum 674 can also be configured to rotate by any angle, for example, 10 degrees, 20 degrees, or 30 degrees in an anticlockwise or clockwise manner, and one of the stoppers 6742 on the rotating drum 674 can be retained at the fixing bone position 6246.

Reference is made to FIGS. 14A to 14E. FIGS. 14A-14E are views showing a process in which a positioning mechanism of a flexible display device releases positioning of a support strap according to the present disclosure. When the flexible display screen 62 needs to be received, the stop bar 621 is pulled outward to cause the flexible display screen 62 to move outward to drive the fixing bone position 6246 to push against the cam 6743, so that the rotating drum 674 slides toward the elastic member 676 along the unfolding direction of the flexible display screen 62, and the elastic member 676 is extruded by the rotating drum 674 to undergo elastic deforming. The guiding face 6746 of one of the teeth 6745 of the front end gear 6744 of the rotating drum 674 slidably pushes against the first orienting bevel 6725 of the first protrusion block 6724 such that the rotating drum 674 rotates along the connecting shaft 678. In this embodiment, the first orienting bevel 6725 slidably pushes against the guiding face 6746 such that the rotating drum 674 rotates by 22.5 degrees in an anticlockwise manner. With the outward pulling force of the stop bar 621 released, the fixing bone position 6246 does push against the cam 6743. The rotating shaft resetting member 651 is elastically reset to drive the rotating drum 674 to rotate reversely, and the flexible display screen 62 retracts toward the enclosure 22 to drive the fixing bone position 6246 to move toward the rotating shaft 64. Meanwhile, the elastic member 676 is elastically reset to push against the rotating drum 674 to slide backward. The guiding face 6749 of one of the teeth 6745 of the front end gear 6744 of the rotating drum 674 slidably pushes against the second orienting bevel 6727 of the second protrusion block 6726 such that the rotating the drum 674 rotates along the connecting shaft 678. In this embodiment, the second orienting bevel 6727 slidably pushes against the guiding face 6749, such that the rotating drum 674 rotates by 22.5 degrees in an anticlockwise manner until the stopper 6742 of the rotating drum 674 which is retained at the fixing bone position 6246 is away from the fixing bone position 6246. At this time, the fixing bone position 6246 is oriented directly toward the spacing between the stoppers 6742. The rotating shaft resetting member 651 drives the flexible display screen 62 to move toward the rotating shaft 64, such that the flexible display screen 62 is wound again on the rotating shaft 64 until the stop bar 621 is retained on an outer surface of the sidewall 225.

Figure 15:
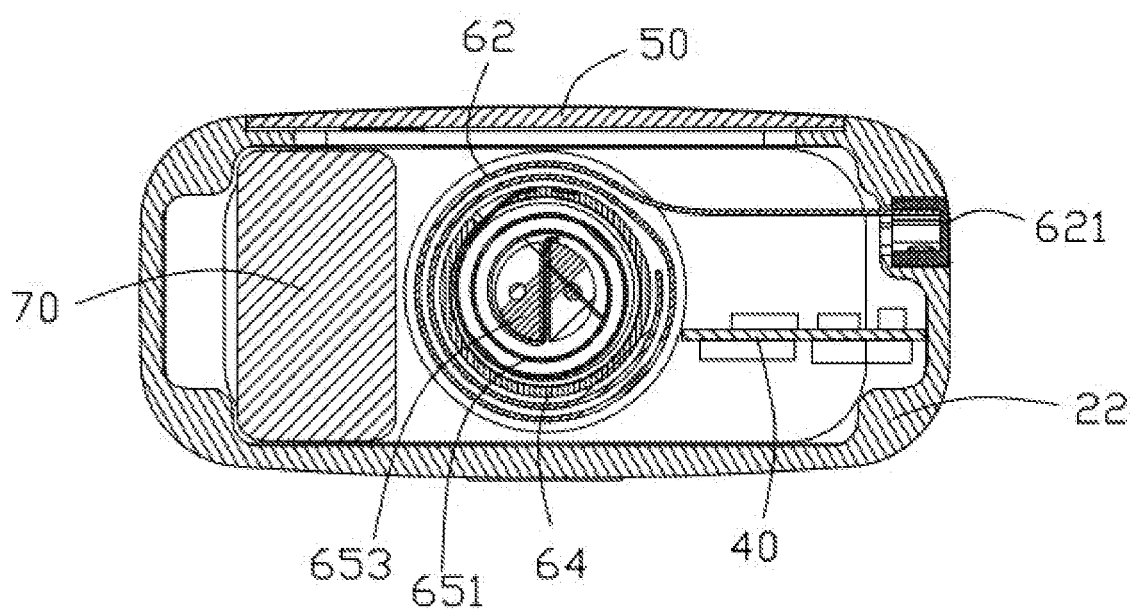
FIG. 15 is a cross-sectional view along the XV-XV line of FIG. 1.

As shown in FIG. 15, the flexible display screen 62 of the electronic apparatus 100 is received within the enclosure 22, so that the portable electronic apparatus 100 is small in size and convenient to carry.

The foregoing are embodiments of the present disclosure. It should be noted that those ordinarily skilled in the art may also make some improvements and modifications on the premise of not departing from the principles of the present embodiments, and these improvements and modification are also considered as falling into the protection scope of the present disclosure.

What is claimed is:

1. A flexible display device, comprising:
   a flexible display screen, provided with at least one support strip, wherein a fixing bone position is arranged on an end of the at least one support strip;
   a rotating shaft, the flexible display screen being wound on the rotating shaft;
   a resetting mechanism, being connected to the rotating shaft, being operable to drive the rotating shaft to rotate to unfold the flexible display screen, and being configured to drive the rotating shaft to rotate in an opposite direction such that the flexible display screen in an unfolded state is wound on the rotating shaft; and
   a positioning mechanism, being configured to retain the fixing bone position to position the flexible display screen in the unfolded state,
   wherein the at least one support strap is configured to support the flexible display screen and is wound or unfolded on the rotating shaft along with the flexible display screen,
   wherein the positioning mechanism comprises a mounting frame, a rotating drum rotatably connected to the mounting frame, an elastic member connected between the rotating drum and the mounting frame, and a plurality of stoppers protruding from the rotating drum, and
   wherein the fixing bone position is retained at one of the plurality of stoppers to position the unfolded flexible display screen.

2. The flexible display device according to claim 1, wherein the at least one of the support straps is made of an elastic material, a cross section of the at least one support strap when being wound on the rotating shaft being in a planar shape, and a cross section of the at least one support strap after being unfolded being in an arc shape.

3. The flexible display device according to claim 1, wherein the at least one support strap is extended along the end of the flexible display screen.

4. The flexible display device according to claim 1, wherein the at least one support strap is sleeved with a flexible thin film to which the flexible display screen is attached.

5. The flexible display device according to claim 1, wherein the mounting frame defines mounting space within which the rotating drum is disposed, an end of the rotating drum away from the rotating shaft being provided with a cam, the plurality of stoppers being located at an end of the rotating drum away from the cam to pull and unfold the flexible display screen, the fixing bone position skipping over the plurality of stoppers to push against the cam such that the rotating drum moves along the unfolding direction of the flexible display screen and rotates along an axis line thereof, the elastic member being elastically compressed, the elastic member being elastically reset to drive the rotating drum when a force of pulling of the flexible display screen is released, such that one of the plurality of stoppers is retained at the fixing bone position.

6. The flexible display device according to claim 5, wherein an end face of the cam facing away from the rotating shaft is provided with a front end gear along the axis line of the rotating drum, and the mounting frame is provided with a first orientating bevel facing the front end gear, the front end gear comprising a plurality of teeth each provided with a guiding face corresponding to the first orientating bevel, and the first orientating bevel slidably pushing against a guiding face of a corresponding tooth of the front end gear to rotate the rotating drum when the rotating drum moves toward the first orientating bevel.

7. The flexible display device according to claim 6, wherein the mounting frame defines a guiding slot at an inner surface of the mounting space parallel to the axis line of the rotating drum, the rotating drum is slidably received in the guiding slot, an end of the guiding slot facing the front end gear being provided with a first protrusion block on which the first orientating bevel is disposed, and the first protrusion block protrudes toward the guiding slot.

8. The flexible display device according to claim 5, wherein an end face of the rotating drum facing the rotating shaft is provided with a rear end gear along the axis line of the rotating drum, and the mounting frame is provided with a second orientating bevel facing the rear end gear, the rear end gear comprising a plurality of teeth each provided with a guiding face corresponding to the second orientating bevel, and the second orientating bevel slidably pushing against a corresponding guiding face of the rear end gear to rotate the rotating drum when the elastic member is elastically reset to drive the rotating drum to move toward the second orientating bevel.

9. The flexible display device according to claim 8, wherein the mounting frame defines a guiding slot at an inner surface of the mounting space parallel to the axis line of the rotating drum, the rotating drum is slidably received in the guiding slot, an end of the guiding slot facing the rear end gear being provided with a second protrusion block on which the second orientating bevel is disposed, and the second protrusion block protrudes toward the guiding slot.

10. The flexible display device according to claim 5, wherein the positioning mechanism further comprises a connecting shaft on which the rotating drum is sleeved, two ends of the connecting shaft being fixed to two ends of the mounting space of the mounting frame.

11. The flexible display device according to claim 10, wherein the elastic member is a spring sleeved on the connecting shaft.

12. The flexible display device according to claim 1, wherein the plurality of stoppers are arrayed in an annular and spaced manner along the axis line of the rotating drum.

13. The flexible display device according to claim 1, wherein the resetting mechanism comprises a rotating shaft resetting member and a positioning member, the rotating shaft resetting member being connected between the positioning member and the rotating shaft.

14. The flexible display device according to claim 13, wherein an end of the rotating shaft facing the positioning member defines a rotating hole, and the positioning member comprises a connecting shaft extending through the rotating hole, the rotating shaft resetting member being received within the rotating hole and being connected between the rotating shaft and the connecting shaft.

15. The flexible display device according to claim 14, wherein the rotating shaft resetting member is a roll-up spring, a first end of the roll-up spring being connected to the connecting shaft, and a second end of the roll-up spring being connected to the rotating shaft.

16. A portable electronic apparatus, comprising:
a housing;
a mainboard disposed within the housing;
a rotating shaft pivotably mounted in the housing; a flexible display screen wound on the rotating shaft, connected to the mainboard, and provided with at least one support strip, wherein a fixing bone position is arranged on an end of the at least one support strip;
a resetting mechanism, being connected to the rotating shaft, being operable to drive the rotating shaft to rotate to unfold the flexible display screen, and being configured to drive the rotating shaft to rotate in an opposite direction such that the flexible display screen in an unfolded state is wound on the rotating shaft; and
a positioning mechanism, being configured to retain the fixing bone position to position the flexible display screen in the unfolded state,
wherein the at least one support strap is configured to support the flexible display screen and is wound or unfolded on the rotating shaft along with the flexible display screen,
wherein the positioning mechanism comprises a mounting frame, a rotating drum rotatably connected to the mounting frame, an elastic member connected between the rotating drum and the mounting frame, and a plurality of stoppers protruding from the rotating drum, and
wherein the fixing bone position is retained at one of the plurality of stoppers to position the unfolded flexible display screen.

17. The portable electronic apparatus according to claim 16, wherein one of sidewalls of the housing defines a strip-shaped slot, the strip-shaped slot being in communication with receiving space of the housing within which the rotating shaft of the flexible display screen is received, the flexible display screen passing from the strip-shaped slot through the housing, an end of the flexible display screen away from the rotating shaft being provided with a stop bar capable of being retained on an outer surface of the housing; and the housing is further provided with a main display screen electrically connected to the mainboard.

18. A driving mechanism for a flexible display screen, comprising:
a rotating shaft with first and second caps engaged with two opposite ends of the rotating shaft to seal two opposite openings of the rotating shaft;
a reset device configured to drive the rotating shaft to rotate to unfold the flexible display screen, the reset device comprising a connecting shaft and a roll-up spring, the connecting shaft configured to extend through the first cap and fixed on one end of the rotating shaft when the flexible display screen is being folded and is being unfolded, the roll-up spring being received in one of the two opposite openings of the rotating shaft corresponding to the connecting shaft, one end of the roll-up spring being embedded in a free end of the connecting shaft, and the other end of the roll-up spring fixed on the rotating shaft; and
a fixing device fixed on the first cap and configured to fix the unfolded flexible display screen and drive the rotating shaft to rotate in an opposite direction such that the flexible display screen in the unfolded state is wound on the rotating shaft
wherein the flexible display screen is provided with at least one support strap, the at least one support strap is configured to support the flexible display screen and is wound or unfolded on the rotating shaft along with the flexible display screen, wherein the fixing device is configured to position the at least one support strap to cause the flexible display screen to be in an unfolded state, and wherein the fixing device comprises a mounting frame, a rotating drum rotatably connected to the mounting frame, an elastic member connected between the rotating drum and the mounting frame, and a plurality of stoppers protruding from the rotating drum, and wherein the at least one support strap is provided with a fixing bone position that is retained at one of the plurality of stoppers to position the unfolded flexible display screen.

* * * * *